(12) United States Patent
Hill et al.

(10) Patent No.: US 6,348,239 B1
(45) Date of Patent: Feb. 19, 2002

(54) METHOD FOR DEPOSITING METAL AND METAL OXIDE FILMS AND PATTERNED FILMS

(75) Inventors: Ross H. Hill; Yo Mao Shi, both of Coquitlam (CA)

(73) Assignee: Simon Fraser University, Burnaby (CA)

( * ) Notice: Subject to any disclaimer, the term of this patent is extended or adjusted under 35 U.S.C. 154(b) by 0 days.

(21) Appl. No.: 09/561,744

(22) Filed: Apr. 28, 2000

(51) Int. Cl.⁷ .................................................. H05H 1/00
(52) U.S. Cl. ........................ 427/533; 427/282; 427/294; 427/383.1; 427/551; 427/552; 427/555; 427/557; 427/558; 427/595; 427/597
(58) Field of Search ................................ 427/533, 551, 427/552–555, 557, 558, 595–597, 282, 294, 383.1

(56) References Cited

U.S. PATENT DOCUMENTS 5,534,312 A     7/1996   Hill et al. .................... 427/533

OTHER PUBLICATIONS

Chung, et al., "Magnetostructural correlations and catecholase–like activities of μ–alkoxo–bridged dinuclear copper(II) complexes with 1–diethylaminopropan–2–ol, $N_3^-$, $NCO^-$ and $NO_2^-$ ligands," J. Chem Soc., Dalton Trans., 1997, pp. 2825–2829 (no month available).

*Primary Examiner*—Bernard Pianalto

(57) ABSTRACT

The invention is directed to a photoresist-free method for depositing films composed of metals, such as copper, or its oxides from metal complexes. More specifically, the method involves applying an amorphous film of a metal complex to a substrate. The metal complexes have the formula $M_f L_g X_h$, wherein M is selected from the group consisting of Ti, V, Cr, Au, Mn, Fe, Co, Ni, Cu, Zn, Si, Sn, Li, Na, K, Ba, Sr, Mo, Ru, Pd, Pt, Re, Ir, and Os, L is a ligand of the formula $(R_2NCR_2'CO)$ wherein R and R' are independently selected from H, $C_nH_m$ and $C_nH_mA_xB_y$ wherein A and B are independently selected from main group elements and f, g, h, n, m, x and y represent integers and wherein X is an anion independently selected from $N_3$, NCO, $NO_3$, $NO_2$, Cl, Br, I, CN, OH, H and $CH_3$. These films, upon, for example, thermal, photochemical or electron beam irradiation may be converted to the metal or its oxides. By using either directed light or electron beams, this may lead to a patterned metal or metal oxide film in a single step.

26 Claims, No Drawings

METHOD FOR DEPOSITING METAL AND METAL OXIDE FILMS AND PATTERNED FILMS

FIELD OF THE INVENTION

This invention relates to the use of metal complexes to deposit films of metals or metal oxides. Such films may be of use in a variety of applications, including but not limited to microelectronics fabrication.

BACKGROUND OF THE INVENTION

Deposition of thin films using non-vacuum techniques normally comprises either sol gel or metal organic materials or comprises photochemical metal organic depositions. Films of inorganic materials are usually deposited by chemical or physical vapor deposition, although in some cases, sol gel or metal organic deposition has been used. The sol gel or metal organic depositions require the construction of films of precursors. These films are then heated to drive off the organic component, leaving a metal or more commonly, a metal oxide film. The photochemical deposition method differs from the above two methods in that the reaction which drives off the organic component is photochemically activated. Since none of these methods are able to form the patterned structures normally used in the construction of microelectronic devices or circuits, they must be employed with other processes in order to pattern films of materials.

Hybrid methods often use light as the energy source wherein the light used initiates a thermal rather than a photochemical reaction. These methods have the disadvantage that they do not directly result in the formation of patterned films but result in the unselective deposition of the films.

Additional disadvantages of the previously described deposition methods are that they require the use of expensive equipment and many of them require high temperature processing.

Because of the problems associated with possible contamination of clean room facilities, a single chemical which may be used for different deposition methods is desirable. Furthermore, the use of a single chemical for different deposition methods reduces the product development expense to the supplier.

Metals, such as copper, may be used as a conductor in electronic circuits. Other metal oxides, such as copper oxide, are semiconductors and have found use as a conductor in electronic circuitry. Accordingly there is much interest in developing methods of achieving the deposition of metals and the patterned deposition of metals or their oxides on various substrates.

U.S. Pat. No. 5,534,312 to Hill et al., incorporated herein by reference, describes a method for the deposition of a variety of metal and metal oxide systems using photochemical deposition. It will be appreciated that the approach discussed therein is a substantial improvement in the prior art. The current invention presents new types of metal complexes or precursors which are useful for thermal, electron beam, and photochemical patterning of copper containing materials and a method for depositing these complexes.

Prior art precursors used to deposit metal or metal oxide films, such as that shown below, and disclosed in U.S. Pat. No. 5,534,312, are known to fragment under photolytic conditions, leading to the loss of $CO_2$. This fragmentation leaves the metal atoms unbound.

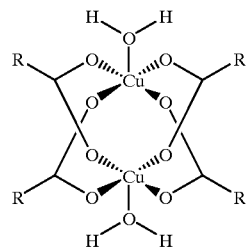

Complexes disclosed by Chung et al. in J. Chem. Soc., Dalton Trans., 1997, p. 2825–29, which is incorporated herein by reference, also comprise a pair of metal atoms bonded to bidentate organic ligands. The most general form of these complexes has the following formula.

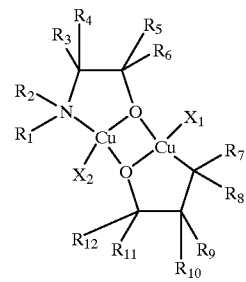

In the above formula, the individual sites where substitution may be used to optimize the physical and chemical properties are shown. The organic ligand framework of these complexes shows no obvious site for fragmentation under, for example, photolytic conditions. Therefore, it is not clear that complexes of this formula should be suitable for photolytic deposition of metals or metal oxides. In fact it could reasonably be predicted that the photochemical reactivity should center about the groups $X_1$ and $X_2$ in the figure. Indeed, the published photochemistry for this complex (Chung et al., (1997) J. Chem. Soc. Dalton Trans., 2825) leads one of skill in the art to expect that photochemistry should yield a stable Cu(I) complex. Based on the prior art, one would not expect it to be possible to use these new precursors to deposit metal or metal oxide films at all. In an amorphous film comprising such a complex, however this is not the case and Cu metal is formed, a highly unexpected result.

It is therefore surprising that new precursors of the form shown above have been found that are useful in depositing films composed of a metal, such as copper, or its oxides. These new precursors exhibit an unexpected fragmentation site to yield the desired metal or metal oxide film. Preliminary mass spectral evidence suggests that the ligand in fact degrades during the photoreaction, a result that was not readily predicted.

SUMMARY OF THE INVENTION

The present invention is directed to a photoresist-free method for depositing films composed of a metal, such as copper, or its oxides from metal complexes. More specifically, the method involves applying an amorphous film of a metal complex to a substrate. The complexes of the present invention are generally of the formula, $M_fL_gX_h$, wherein M is selected from the group consisting of Ti, V, Cr, Au, Mn, Fe, Co, Ni, Cu, Zn, Si, Sn, Li, Na, K, Ba, Sr, Mo, Ru, Pd, Pt, Re, Ir, and Os, L is a ligand of the formula ($R_2NCR_2'CO$) wherein R and R' are independently selected from H, $C_nH_m$ and $C_nH_mA_xB_y$ wherein A and B are independently selected from main group elements and f, g, h, n, m, x and y represent integers, and X is an anion independently selected from $N_3$, NCO, $NO_3$, $NO_2$, Cl, Br, I, CN, OH, H, $CH_3$. In a preferred embodiment, the metal is dinuclear copper, the ligand is 1-diethylaminoethan-2-ol, and the anion is selected from $N_3$, NCO, and $NO_2$.

These films, upon either thermal, photochemical or electron beam stimulus may be converted to a metal or its oxides. By using either directed light or electron beams, this may lead to a patterned metal or metal oxide film in a single step. The metal (e.g., copper) or its oxide (e.g., copper oxide) deposited by this method is conductive. Accordingly, these metal precursors and the deposition of the metals or their oxides from such precursors is a useful invention.

DETAILED DESCRIPTION OF THE PREFERRED EMBODIMENTS

The current invention describes the use of complexes of metals such as copper, to form films which may be activated by thermolysis, charged particles (such as electron beams), or photons to deposit copper containing films.

An amorphous precursor film comprising the complex is deposited onto a substrate using methods well known in the art, such as spin or dip deposition. This film is then exposed to electromagnetic radiation or electron or ion beams. This exposure results in the conversion of the exposed areas from the precursor material to the desired amorphous film of the metallic material. The precursor complexes of the present invention are generally of the formula, $M_fL_gX_h$, wherein M is selected from the group consisting of Ti, V, Cr, Au, Mn, Fe, Co, Ni, Cu, Zn, Si, Sn, Li, Na, K, Ba, Sr, Mo, Ru, Pd, Pt, Re, Ir, and Os, L is a ligand of the formula ($R_2NCR_2'CO$) wherein R and R' are independently selected from H, $C_nH_m$ and $C_nH_mA_xB_y$ wherein A and B are independently selected from main group elements and f, g, h, n, m, x and y represent integers, and X is an anion independently selected from $N_3$, NCO, $NO_3$, $NO_2$, Cl, Br, I, CN, OH, H, $CH_3$.

An example of such precursor complexes include dinuclear copper complexes with suitable bidentate ligands. Suitable ligands include: $\mu$-aminopropan-2-olate, diethylaminoethan-2-olate, diethylaminobutan-2-olate, and the like. Related complexes are disclosed by Chung et al. in J. Chem. Soc., Dalton Trans., 1997, p. 2825–29. Such dinuclear copper precursor complexes are generally of the formula: $Cu_2(\mu-R_2NCR'CO)_2(X)_2$, wherein R and R' are independently selected from H, $C_nH_m$ and $C_n H_m A_x B_y$ wherein A and B are independently selected from main group elements and n, m, x and y represent integers, and X is an anion independently selected from $N_3$, NCO, $NO_3$, $NO_2$, Cl, Br, I, CN, OH, H, and $CH_3$.

Although dinuclear copper complexes with bidentate ligands are exemplified in the present disclosure, the present invention is not limited to copper complexes. Other suitable metals that can be used in the present invention include: Ti, V, Cr, Au, Mn, Fe, Co, Ni, Cu, Zn, Si, Sn, Li, Na, K, Ba, Sr, Mo, Ru, Pd, Pt, Re, Ir, Os and similar metals. One skilled in the art could determine the corresponding stoichiometry for the particular metal and the general ligand formulations provided above.

Presently, preferred metal complexes include $Cu_2(\mu-Et_2NCH_2CH_2O)_2(N_3)_2$, $Cu_2(\mu-Et_2NCH_2CH_2O)_2(NCO)_2$, and $Cu_2(\mu-Et_2NCH_2CH_2O)_2(NO_2)_2$.

Typical films may be deposited on various substrates. These include materials as wide ranging as simple salts, such as $CaF_2$, to semiconductor surfaces such as silicon. The nature of the substrate is not critical for the process although it may affect the method of deposition of the precursor film and the solvent for the deposition, if one is used. Applicable solvents include acetone, dimethylsulfoxide, dimethylacetamide, 2-methoxyethanol and the like. The most commonly used substrate has been silicon but is not limited thereto. These silicon substrates may have been coated with other layers such as dielectric layers, photoresist or polyimide, metal oxides, thermal oxides, conduction materials, insulating materials, ferroelectric materials, or other materials used in the construction of electronic devices. These include single crystal wafers.

The precursor film may be deposited on the surface by spin coating the molecule from a solvent. In this procedure, the precursor is dissolved in a solvent to form a precursor solution. The substrate surface is then put on a surface which can be spun. The substrate may be held in place with a vacuum chuck, such as present in a commercial spin coater (e.g., from Headway or Laurell Corporation). The precursor solution is dispensed onto the surface of the substrate either before commencing spinning or while the substrate is spinning. The substrate is then allowed to spin, resulting in the deposition of a thin film of the precursor on the surface.

The film thickness obtained in this process can be varied by varying both the spin rate and the concentration of the precursor in the solvent. To obtain a suitable film, the spin speed may be changed during the spinning process.

The films may also be formed by other methods known to those skilled in the art, including, but not limited to, spray on coating, dip coating, and various inking methods. Additives may be included, for example, to improve the quality of the resultant film by preventing cracking or to enhance another film property. Examples of such additives include, but are not limited to, monoethanolamine and diethanolamine. One skilled in the art could determine other suitable additives to suit the particular purpose.

The film is then exposed to a source of irradiation. Typically, the film may be exposed to light directed through an optical mask used to define a pattern on the surface. The mask consists of transparent and light absorbing regions. The mask may also include an optical enhancing feature such as a phase shift technology. Exposure of the film with this light results in a chemical reaction within the film which changes the film from precursor to the product.

The light does not necessarily have to be directed through a mask. For example, if it is not necessary to pattern the material, a flood exposure may be used. Alternatively, if patterning is desired, a direct writing approach may be used. In a common implementation of the direct writing process, a laser beam is directed in a serial fashion over the surface, resulting in exposure only of the areas where the beam was directed. Alternatively, near field optical systems allow selective exposure of some areas of the surface.

Normally, the atmosphere used for the exposure is air. It may, for a variety of reasons, be preferable to change the composition of the atmosphere present during exposure. One reason is to increase the transmission of the exposing light, if short wavelength light is used, because it may be attenuated by air. It may also be desirable to change the composition of the atmosphere to alter the composition or properties of the product film. For example, in air or oxygen, the exposure of a copper complex results in the formation of a copper oxide. By changing the humidity of the atmosphere, the amount of water in the film may be changed. By eliminating oxygen entirely from the atmosphere, a film consisting primarily of copper may be formed. By increasing the intensity of the light, it is possible to initiate a thermal reaction within the films to generate product films.

Exposure may also be carried out with ion or electron beams. These are normally directed in a serial write process. The ion or electron beam is directed onto the precursor film, causing a reaction to produce the product film in the exposed areas. The nature of the exposure systems for ion and electron beams is such that these are normally done within a vacuum. The deposit from such a process may, depending upon the conditions, be the metal which upon exposure to air is oxidized to form the oxide.

Thermal energy may also be used to convert the precursor films to copper based films. This may find specific use if some areas are patterned to form copper layers, then in a thermal reaction the remaining material is converted to copper oxide by thermolysis in air. Alternatively, the copper regions may be photo-patterned and the remaining areas may undergo unselective thermal reaction. It should be noted, however, that some oxidation of the deposited copper may occur and this film may be the preferred use of this process.

EXAMPLE 1

In a preferred embodiment, a precursor $Cu_2(\mu\text{-}Et_2NCH_2CH_2O)_2(N_3)_2$ was deposited on a substrate. The $Cu_2(\mu\text{-}Et_2NCH_2CH_2O)_2(N_3)_2$ film was then photolyzed with ultraviolet light (254 nm) in a nitrogen atmosphere. The progress of the reaction was monitored by Fourier transform infrared spectroscopy. Following exhaustive photolysis, the conductivity of the film was measured. The films were found to have a conductivity of 1.8 $\mu\Omega$cm. The films were examined and found to consist of copper.

Alternatively, a similar precursor film exposed in air resulted in the formation of copper oxide. This oxide film could be reduced by hydrogen or any other suitable reductant at elevated temperatures to yield copper films.

EXAMPLE 2

In another preferred embodiment, a mixture of two precursors composed of both $Cu_2(\mu\text{-}Et_2NCH_2CH_2O)_2(N_3)_2$ and $Cu_2(\mu\text{-}Et_2NCH_2CH_2O)_2(NCO)_2$ was deposited to form a film. This film was photolyzed to form a conductive copper based film.

EXAMPLE 3

In another embodiment, a film of $Cu_2(\mu\text{-}Et_2NCH_2CH_2O)_2(N_3)_2$ was deposited and photolyzed through a lithography mask. The resultant film was rinsed with ethylacetate and a copper oxide pattern remained on the surface.

EXAMPLE 4

In another embodiment, the metal complexes were mixed with an additional chemical agent to lessen the effect of shrinkage. Such agents may in some cases act by preventing the ordering which results in the structured layered films. One example of such an agent which has been tested is diethanolamine. The lithographic deposition of the metal complexes then occurs with improved image replication.

EXAMPLE 5

In another embodiment, a mixture of $Cu_2(\mu\text{-}Et_2NCH_2CH_2O)_2(N_3)_2$ and $UO_2(O_2CC_5H_{11})_2$ was cast as a thin film. This material was photolyzed, leading to a film whose complex was that of a copper uranium oxide.

Those skilled in the art will appreciate that variations to the above-described methodology may occur without departing from the scope of the invention.

What is claimed is:

1. A method for producing a patterned film of a metal containing material on a substrate comprising:
    a) depositing an amorphous film of a metal precursor complex of the formula: $M_fL_gX_h$, wherein M is selected from the group consisting of Ti, V, Cr, Au, Mn, Fe, Co, Ni, Cu, Zn, Si, Sn, Li, Na, K, Ba, Sr, Mo, Ru, Pd, Pt, Re, Ir, and Os, L is a ligand of the formula $(R_2NCR_2'CO)$ wherein R and R' are independently selected from H, $C_nH_m$ and $C_nH_mA_xB_y$ wherein A and B are independently selected from main group elements and f, g, h, n, m, x and y represent integers and wherein X is an anion independently selected from $N_3$, NCO, $NO_3$, $NO_2$, Cl, Br, I, CN, OH, H and $CH_3$; and
    b) irradiating said amorphous film to cause said metal complex to undergo a reaction which transforms said metal complex into a metal containing material adherent to said substrate.

2. The method of claim 1 wherein said irradiating is accomplished by directing laser beam.

3. The method of claim 1 wherein said irradiating is accomplished by heating.

4. The method of claim 1 wherein said irradiating is accomplished utilizing an electron beam.

5. The method of claim 1 wherein said irradiating is accomplished utilizing an ion beam.

6. The method of claim 1 wherein said irradiating is accomplished utilizing a source of visible light.

7. The method of claim 1 wherein said irradiating is accomplished utilizing a source of ultraviolet light.

8. The method of claim 1 additionally comprising the step of reducing said metal containing material after said irradiating step.

9. The method of claim 1 wherein said irradiating step is carried out in a vacuum.

10. The method of claim 1 wherein said irradiating step is carried out in a controlled atmosphere.

11. The method of claim 10 wherein said controlled atmosphere is air.

12. The method of claim 10 wherein said controlled atmosphere is nitrogen.

13. The method of claim 1 additionally comprising the step of covering said amorphous film with a mask that leaves said patterned area exposed.

14. The method of claim 1 wherein the resulting film is a metal oxide.

15. The method of claim 1 wherein said metal, M, contains Cu.

16. The method of claim 1 wherein said metal is a dinuclear copper.

17. The method of claim 1 wherein said anion is $N_3$.

18. The method of claim 1 wherein said group R is Ethyl.

19. The method of claim 1 wherein said substrate is silicon.

20. The method of claim 1 wherein said substrate is $CaF_2$.

21. A method for producing a copper containing film on a substrate comprising:
    a) depositing an amorphous film of a dinuclear copper complex of the formula $Cu_2(\mu\text{-}R_2NCR_2'COO)_2(X)_2$ wherein R and R' are independently selected from the group consisting of H, $C_nH_m$ and $C_nH_mA_xB_y$ wherein A and B are independently selected from main group elements and n, m, x and y represent integers, wherein X is an anion selected from the group consisting of $N_3$, NCO, $NO_2$; and b) irradiating said film to cause said metal complex to undergo a reaction which transforms said copper complex into a copper containing material adherent to said substrate.

22. The method of claim 1 wherein additives have been added to the metal precursor complex to improve the quality of the resultant film.

23. The method of claim 1 wherein the film contains one or more metal complexes in addition to said metal complex.

24. The method of claim 1 wherein an additive is used to improve the film forming quality.

25. The method of claim 1 wherein the metal is a transition metal.

26. The method of claim 1 wherein said irradiating is carried out by photolysis.

\* \* \* \* \*

UNITED STATES PATENT AND TRADEMARK OFFICE
CERTIFICATE OF CORRECTION

PATENT NO. : 6,348,239 B1
DATED : March 7, 2003
INVENTOR(S) : Ross H. Hill and Youmao Shi It is certified that error appears in the above-identified patent and that said Letters Patent is hereby corrected as shown below:

<u>Title page,</u>
Item [75], Inventor, the name reading "Yo Mao Shi" should read -- Youmao Shi --.
Item [57], ABSTRACT,
Line 9, the text reading "$(R_2NCR_2'CO)$ wherein R and R'" should read
-- $(R_2NCR'_2CR''_2O)$ wherein R, R' and R" --.

<u>Column 3,</u>
Lines 2 and 35, the text reading "$(R_2NCR_2'CO)$ wherein R and R'" should read
-- $(R_2NCR'_2 CR''_2O)$ wherein R, R' and R" --.
Line 48, the text reading "$Cu_2(\mu-R_2NCR'CO)_2X_2$, wherein R and R'" should read
-- $Cu_2(\mu-R_2NCR'_2CR''_2O)_2X_2$, wherein R, R' and R" --.

<u>Column 6,</u>
Line 12, the text reading "$(R_2NCR_2'CO)$ wherein R and R'" should read
-- $(R_2NCR'_2CR''_2O)$ wherein R, R' and R" --.

Signed and Sealed this

Eighth Day of July, 2003

JAMES E. ROGAN
*Director of the United States Patent and Trademark Office*